(12) United States Patent
Suaris et al.

(10) Patent No.: US 7,251,803 B2
(45) Date of Patent: Jul. 31, 2007

(54) MEMORY RE-IMPLEMENTATION FOR FIELD PROGRAMMABLE GATE ARRAYS

(76) Inventors: Peter Ramyalal Suaris, 4021 NW. Barlow Ct., Camas, WA (US) 98607; Lung-Tien Liu, 3638 Lorimer La., Encinitas, CA (US) 92024; Yuzheng Ding, 26 Wentworth Dr., Berkeley Heights, NJ (US) 07922; Nan-Chi Chou, 87 Comanche Ct., Fremont, CA (US) 94539

( * ) Notice: Subject to any disclaimer, the term of this patent is extended or adjusted under 35 U.S.C. 154(b) by 505 days.

(21) Appl. No.: 10/785,608

(22) Filed: Feb. 23, 2004

(65) Prior Publication Data

US 2005/0093571 A1 May 5, 2005

Related U.S. Application Data

(60) Provisional application No. 60/532,368, filed on Dec. 23, 2003, provisional application No. 60/517,654, filed on Nov. 5, 2003.

(51) Int. Cl.
*G06F 17/50* (2006.01)
(52) U.S. Cl. .......................................... 716/16; 716/18
(58) Field of Classification Search ................ 716/2–3, 716/6, 16–18; 326/37
See application file for complete search history.

(56) References Cited

U.S. PATENT DOCUMENTS

| 6,813,754 | B2* | 11/2004 | Wu et al. ...................... 716/10 |
| 2005/0204325 | A1* | 9/2005 | Fung et al. .................... 716/16 |
| 2006/0117280 | A1* | 6/2006 | Wallace ......................... 716/4 |
| 2006/0241921 | A1* | 10/2006 | Willis ............................. 703/2 |

OTHER PUBLICATIONS

Suaris et al., "Incremental Physical Resynthesis for Timing Optimization", Feb. 22, 2004.

* cited by examiner

*Primary Examiner*—Stacy A Whitmore
(74) *Attorney, Agent, or Firm*—Klarquist Sparkman LLP

(57) ABSTRACT

Memory modules implemented on an FPGA device are re-implemented to improve the performance of the device, such as to reduce logic delays. One or more logic blocks of the FPGA device that realize the logic function of a memory module or portion of a memory module are desirably selected. Based on the outcome of a timing analysis, the most critical signal pin of the selected logic blocks may be identified. Methods of deriving the memory module re-implementation for various types of the most critical pins are disclosed. Procedures are described for integrating physical timing analysis, memory transformation, placement, and routing, as well as for the selection of logic blocks for re-implementation.

13 Claims, 10 Drawing Sheets

MEMORY RE-IMPLEMENTATION FOR FIELD PROGRAMMABLE GATE ARRAYS

CROSS REFERENCE TO RELATED APPLICATIONS

This application claims the benefit of U.S. Provisional Patent Application Ser. No. 60/517,654, filed Nov. 5, 2003, entitled "Intelligent RAM Conversion", inventors: Peter R. Suaris, Lung-Tien Liu, Yuzheng Ding and Nan-Chi Chou and also claims the benefit of U.S. Provisional Patent Application Ser. No. 60/532,368, filed Dec. 23, 2003, entitled "Memory Re-Implementation For Field Programmable Gate Arrays", inventors: Peter R. Suaris, Lung-Tien Liu, Yuzheng Ding and Nan-Chi Chou

TECHNICAL FIELD

The present invention relates generally to the field of Field Programmable Gate Array (FPGA) technology and, more particularly, to the implementation of memory on a FPGA device.

BACKGROUND

FPGA technology provides a flexible means to quickly transform a logic design into a working microelectronic chip by allowing a pre-fabricated chip to be programmed according to the specific design. An FPGA device (chip) comprises logic blocks, interconnects and input/output (I/O) blocks. These are pre-fabricated logic resources on an FPGA device with fixed locations, but many, and desirably most, of the resources on an FPGA device can be programmed to realize different logic functions and generate different signal paths to realize different logic designs.

There are usually two types of logic blocks on an FPGA device. The generic or generic logic block type can be programmed to realize any of many different logic functions. The dedicated type of logic block can only be programmed to realize a specific type of logic function (but in different sizes and configurations). One example of a function of a dedicated logic is as a memory module. In such a case, the dedicated logic block when programmed is a dedicated memory module. Most of the logic blocks on an FPGA device are of the generic type. Generic logic blocks are typically evenly distributed on an FPGA device. The logic blocks of the dedicated type are available only for limited types of logic functions and typically are only available in small quantities. Dedicated logic blocks are sparsely located on an FPGA device.

Memory modules or memory elements are important components of modern logic circuit designs. A simplified view of a memory module is as a collection of memory cells, each of which can store a single bit of information and can be read from and/or written into. The input/output signals pertaining to reading the information form a read port. The signals pertaining to writing the information form a write port. A port, in one alternative form, can also serve as both a read port and a write port.

A port in one exemplary form comprises an address bus, which is desirably a collection of input signals that select the memory cells to be accessed. A read port in one form has an output data bus, which is desirably a collection of signals that carries the information from selected memory cells. A write port in one form has an input data bus, which is desirably a collection of signals that carry information that is to be written to the selected memory cells. Each port also desirably has a number of control signals, such as clock signals that synchronize the operations of the memory module, enable signals that enable and disable the operations, and set/rest signals that apply special content to the memory cells and/or the output buses.

In one form of design implementation using an FPGA device, a memory module may be realized using generic logic blocks. This form of memory module implementation is referred to as a distributed memory implementation. Alternatively, in another form of design implementation using an FPGA device, a memory module may be realized using dedicated logic blocks for memories. This latter form of memory module implementation is referred to as a block memory implementation. If the size of the memory module exceeds the capacity of a single logic block of the chosen type, multiple blocks can be used, including blocks realizing the memory cells, and blocks realizing auxiliary logic that combine the blocks realizing the memory cells together.

It is rare that a memory module will fit into a single generic block. Memory implementation using dedicated memory blocks is often more efficient for large memory modules and is therefore often preferred by those skilled in the art of FPGA design. On the other hand, dedicated memory blocks on a FPGA are of limited quantity. When the total need for memory modules in a circuit design being implemented on an FPGA exceeds the available supply of dedicated memory blocks, or when other concerns arise, some memory modules may have to be implemented using distributed generic logic blocks. Determining which realization strategy to use for a memory module, or a portion of a module, is an important decision in the art of FPGA design.

Known approaches for implementing memory in a circuit design on an FPGA determine which blocks to be used to implement memory module(s) prior to the logic functions of the design being arranged and connected on the FPGA device. This is necessary in these known approaches because the arrangement and connection (placement and routing) requires that the logic functions be generated first. However, this also limits the ability to determine the optimal strategy for memory realization.

Because dedicated blocks are few and sparsely positioned, a memory module which is implemented using a dedicated block may have to be placed far away from its signal sources and/or destinations, yielding large signal propagation delays from and/or to the memory module. This adverse impact is difficult to foresee prior to placement and routing. Similarly, the implementation of memory using a combination of distributed blocks may also result in exceedingly large signal propagation delays at their inputs and/or outputs. In addition, large delays may be present in block-to-block interconnects, such as when there are so many logic blocks in the memory that they cannot readily be placed in a close proximity with their signal sources and/or destinations. Again, such impacts may only become clear after placement and routing is completed. In either case, any larger than anticipated signal delays will cause the design to operate at a slower speed.

Accordingly, a need exists for improvements in memory implementation on FPGAs which desirably takes into consideration the resource availability and distribution.

SUMMARY

The present invention is directed to all novel and-non-obvious method acts and features disclosed herein both alone and in novel and non-obvious combinations and subcombinations with one another. The present invention is not limited to the illustrative embodiments disclosed herein and is not limited to the solution of one or more problems of the prior art such as set forth herein.

According to one aspect of an embodiment, a circuit design which includes one or more memory modules is first realized, such as in accordance with prior art approaches. The memory realization strategy in accordance with this embodiment is then re-evaluated, after the design is arranged and connected on the FPGA device. In so doing, the flaws of the prior strategy are typically revealed, and remedies may be planned and executed. A memory module or portion thereof is decomposed according to the evaluation. The memory module or portion thereof may be re-implemented using one or more different strategies. Each of the one or more embodiments of the re-implementation may be re-evaluated and an appropriate implementation may then be selected. Various methods for re-implementing memory modules and for choosing among such re-implementations are disclosed herein.

According to yet another aspect of an embodiment, a re-implemented memory module may be immediately re-arranged, re-connected, and re-evaluated. In so doing the benefit of the re-implementation, or the lack thereof, is immediately evident. The analysis of such re-implementation may alternatively be delayed. The re-implementation may be reversed to an earlier implementation, to the immediately previous implementation, or to another alternative implementation if a particular re-implementation is non-beneficial for a specific circuit design or memory module. Desirably, the reversal is to the immediately prior implementation.

These and other aspects, features, method steps and advantages of the technology will become apparent from the following description and referenced drawings.

DETAILED DESCRIPTION OF EMBODIMENTS

In the following description, the term "design" means an abstract logic system or representation of an electronic circuit that is to be transformed into a micro-electronic device, a chip or actual physical circuit that can operate in its intended environment, such as in electronic equipment such as a computer. In addition, in this description, the term "implementation" means the realization of the design on an FPGA device. The realization is by means of programming the device, which includes configuring the logic blocks (synthesis), arranging the blocks on the device (placement), and connecting the signals or blocks (routing). For each type of FPGA device, the procedure and outcome of the programming may be unique. The technology disclosed herein is not limited to any specific form of FPGA, but instead has generic applicability. In the description below, hypothetical exemplary FPGA devices and logic designs will be used for illustrative purposes.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

At least a portion of the disclosed methods can be performed using software stored on a computer-readable medium and executed on a computer. Such software can comprise, for example, electronic-design-automation (EDA) software tools, such as design and verification tools. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

Block and Distributed Implementations

Figure 1:
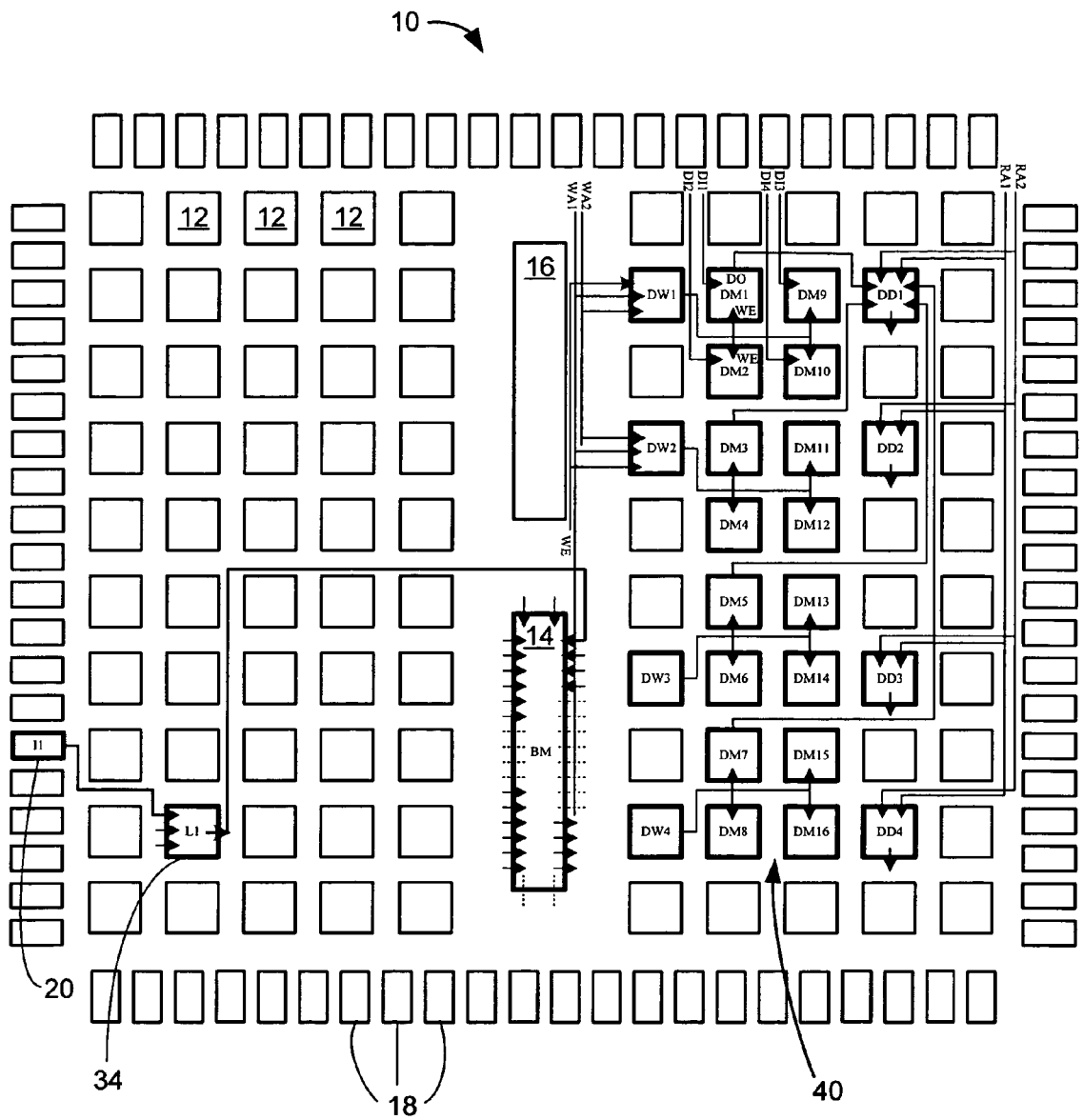
FIG. 1 is a simplified diagrammatic view of an exemplary FPGA device, and a distributed implementation of a memory module and a dedicated block implementation of a memory module on the exemplary FPGA device.

FIG. 1 illustrates an exemplary FPGA device 10. FPGA 10 contains a number of generic logic blocks represented by the small squares, some of which are numbered as 12. The illustrated FPGA 10 also has two dedicated memory logic blocks 14,16, illustrated by the larger rectangles in FIG. 1. More or fewer generic logic block and dedicated logic blocks may be included in an FPGA, together with a plurality of other elements. In the exemplary illustrated FPGA 10, each generic logic block 12 can implement a dual-port memory with an address bus of up to four bits and a data bus of one bit; or a generic logic function of up to six input bits and one output bit. In addition, in this example, each dedicated memory logic block 14,16 can implement a dual-port memory with an address bus of up to eight bits and a data bus of four bits. The implementation depends upon the programming of the FPGA device. The small rectangles depicted around the border of the FPGA 10 of FIG. 1 represent the input/output blocks of the FPGA. Some of these input/output blocks are numbered as 18 in FIG. 1. For convenience, much of the routing between the various blocks of FPGA 10 is omitted in FIG. 1. One specific input block of FIG. 1 has been assigned the number 20 in this figure and is also designated as I1.

Figure 2:
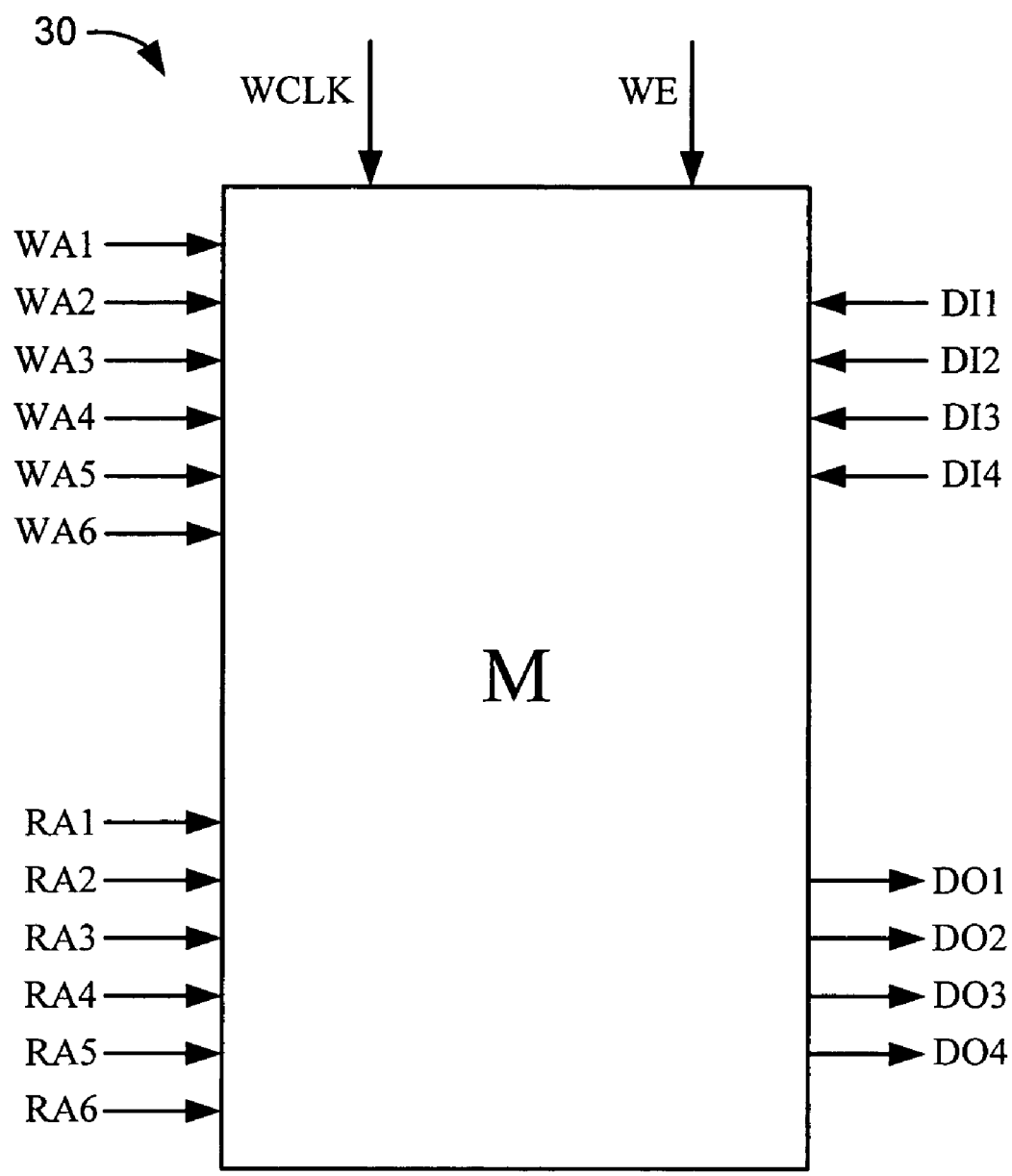
FIG. 2 is a simplified diagrammatic view of one form of an exemplary memory module, which is used in FIG. 1 and the subsequent FIGS. 3 through 8.

A specific example of a memory module M that is to be implemented on the FPGA is shown in FIG. 2 and is designated by number 30. The illustrated memory module 30 has an asynchronous read port, consisting of a 6-bit address bus (RA1 to RA6), and a 4-bit output data bus (DO1 to DO4). Module 30 also has a synchronous write port, consisting of a 6-bit address bus (WA1 to WA6), a clock signal input (WCLK), an enable signal input (WE), and a 4-bit input data bus (DI1 to DI4). Other alternative forms of memory modules may also be implemented on an FPGA device.

Two instances of the memory module 30 or M are implemented on the FPGA device 10 as illustrated in FIG. 1. One of the memory module instances uses a dedicated memory block implementation and is indicated by BM or 14 in FIG. 1. The dedicated memory logic block 14 can accommodate one of the entire memory modules 30 (unused pins are illustrated in dotted lines). The signals coming into and going out of the memory module 14 are connected to other logic blocks and /or input/output blocks; these are not shown in this drawing except for the input 20 (I1) and a logic block 34 (L1), which corresponds to one of the generic logic blocks 12 in this example.

The other instance of memory module 30 that is implemented in FIG. 1 is indicated generally by the number 40 and is implemented as a distributed implementation This distributed implementation 40 is accomplished by the use of 24 generic logic blocks. Amongst them, 16 are used as memory blocks having 4-bit address paths and 1-bit data paths (DM1 to DM16). These use read addresses RA3 to RA6 and write addresses WA3 to WA6, and WCLK as write clock. They are divided into 4 groups, each using one data input signal and output a candidate signal for data output. For example, DM1, DM3, DM5 and DM7 form a group that uses DI1 as data input. Another 4 logic blocks (DW1 to DW4) are used to decode the extra 2 bits of write addresses WA1 and WA2; the decoded values are combined with the original write enable signal to produce write enable signals for the memory blocks. For example, DW1 will output logic value 1 if WE=1, WA1=0 and WA2=0, which allows memory blocks DM1 to DM4 to be written into. The remaining 4 logic blocks (DD1 to DD4) are used to select the output bit based on the two extra bits of read addresses RA1 and RA2. For example, DD1 produces the DO1 output signal of memory module 40 by selecting amongst the outputs of DM1, DM3, DM5, and DM7 according to the values of RA1 and RA2. The logic blocks DW1 to DW4 and DD1 to DD4 are programmed accordingly to provide said functionality; their specific logic functions are evident to those skilled in the art and are thus not shown. The signals coming into and going out of the memory modules 14 and 40 are connected to other logic blocks and/or input/output blocks; these are not shown. Only a small number of interconnects and pins are illustrated in FIG. 1: The majority of the pins and interconnects are not shown in FIG. 1 in order to keep the drawings simple, since they are evident to those skilled in the art and would depend on the configuration of the specific circuit being implemented by the FPGA.

Timing Analysis

A design usually has a required operating speed. The operating speed is often limited by the time it takes for a signal to propagate from one part of a circuit design to another. A procedure known as timing analysis can be applied to a design to determine (1) the maximum allowed time for a signal to propagate from one point of the design to another, and (2) the actual time the propagation will take. In determining the latter, a timing model may be used to calculate the signal propagation delay incurred through each logic block and connection. When a circuit design is implemented on an FPGA device, the types and locations of the involved logic resources (blocks and connects) are known, therefore the timing delay calculation can be accurately based on the actual physical characteristics of the resources. This is referred to as physical timing analysis. When an implementation of a circuit on an FPGA is modified, timing analysis is desirably updated to reflect the changes. If the change in the circuit implementation is limited, the update may be performed efficiently by focusing on the portions of the circuit implementation that are affected by the changes; this is referred to as incremental timing analysis. Suitable timing analysis procedures and tools, including those for physical timing analysis and incremental physical timing analysis, are known to those skilled in the art, thus are not described herein.

With reference to FIG. 1, the signal path from input block 20 (I1) through generic logic block 34 (L1) (whose content is not important to the illustration) to block 14 (BM) has an actual delay, which, as an example, may be 3 time units. The difference between the maximum allowed delay and the actual delay is known as the slack. A negative slack is indicative of a timing violation. In this exemplary design, assume the allowed delay from input block 20 to memory module 14 is 2 time units. In this exemplary case, the slack for this path is then minus 1 (2-3). This makes the logic blocks 34 (L1) and 14 critical. A logic block may be on multiple signal paths. The smallest (or most negative) slack of all the paths is the worst slack of the block; the input or output of the block that carries the worst slack is defined as the most critical pin of the block. One block is more critical than another if the one block has a most critical pin that carries a worse slack than the other.

In a desirable approach, timing analysis is performed after the initial implementation of a design. The initial design implementation can be based on any suitable approach. Methods of implementing designs are known. The timing analysis provides a sufficiently complete and accurate picture concerning the required and actual delays of all relevant signal paths. Physical timing analysis may be used to identify any critical pins and the most critical pin of the initial implementation of a memory module in a design as well as of any re-implementation of the memory module. The design may be transformed or modified, according to the outcome of timing analysis, such as explained below. After each transformation, physical timing analysis, and desirably incremental physical timing analysis, may be performed to coordinate the timing of the re-arranged and reconnected logic blocks. In so doing, accurate information concerning the allocated and actual delays of all signal paths, based on resource allocation and distribution, will be kept current. This facilitates the determination of modified implementation strategies for memory modules with improved timing characteristics.

Although physical timing analysis is the desirable means of acquiring timing information, timing analysis based on other models and/or design/device characteristics can also be used in place of physical timing analysis. The only drawback is the potentially lower accuracy, which may yield less improvement.

Identifying One or More Targets for Re-implementation

With the results of the timing analysis, the criticality of the logic blocks that realize memory modules becomes evident. Re-implementation of one or more or all of the memory modules, or portions of such one or more memory modules, can be performed to improve the design. Alternatively, confirmation may be made of the desirability of a particular memory module implementation such that a re-implementation is unnecessary or undesirable.

A number of embodiments of approaches for evaluating and re-implementing memory modules in an FPGA are described below. In one illustrative approach, a designer (user) selects, for example by means of a graphical user interface or scripting language, one or more logic blocks that implement a memory module and that are desired for re-implementation. The user may identify the most critical pin and other critical pins, if any. Alternatively, a computer program may automatically (or semi-automatically with user input which is a form of user selection) identify the most critical logic block(s) or most critical pin (and other critical pins, if any) or a block of one or more memory modules having a path with negative slack for targeting for re-implementation. A combination of these approaches may also be used. The re-implementation approaches do not specify, or depend on, the method of selecting the targets, although the above methods which are based on slacks are desirable.

In accordance with these approaches, one or more memory modules implemented by the selected logic blocks are re-evaluated for possible re-implementation to, for example, improve the timing characteristics and/or to optimize the timing characteristics. The approach used in re-implementing a memory module may depend upon the type and location of the most critical pin. Several embodiments are set forth below to illustrate exemplary memory module re-implementation techniques.

Optimizing a Critical Data Signal

One embodiment addresses the case where an identified critical logic block of a memory implementation is a dedicated memory block, and the most critical pin is a data in (DI1 to DI4 with reference to FIG. 2) or data out (DO1 to DO4 with reference to FIG. 2). In this embodiment, during memory re-implementation, the most critical data signal is desirably separated from its original memory logic block, which has a restricted location, to be relocated physically closer to the source and/or destination of the signal. This is desirably achieved by first dividing the memory element or function implemented by the identified critical logic into two parts. One part (Part 1) will desirably contain the memory cells whose information is accessed through the most critical data pin. The other part (Part 2) will desirably contain the rest of the memory cells accessed through data pins other than the most critical pin. Each part is desirably re-implemented separately. Part 2 will be re-implemented by using a dedicated block implementation, and, for example, may occupy the original dedicated logic cell. Part 1, in this case, may be re-implemented either via a distributed memory implementation or via a block memory implementation, and re-arranged and re-connected. A rule set may desirably be used to accomplish the determination of the new implementation strategy for Part 1. A specific exemplary rule set is as follows:

- If only one new implementation (distributed or dedicated) is feasible (by feasible it is meant that there are enough logic and interconnect resources on the FPGA device that will accommodate the re-implemented design, including both the modified and unmodified portions), it is used.
- If both distributed implementation and dedicated implementation are feasible, but only one is beneficial (by beneficial it is meant that either the worst slack of the design becomes less negative, or the worst slack of the design does not become more negative while the worst slack of the target memory block becomes less negative), this one is used.
- If both new implementations are beneficial, the selection will be based on the amount of benefit (in terms of the slack change) and/or other factors, such as dependent on the specific device and design. For example, in a desired approach, a cost function may be used that considers the increase in use of logic and interconnect resources versus their availability, and the existence of other critical logic blocks; the use of a gain function that considers the reduction and/or elimination of negative slacks; and with the ratio of gain over the cost being used to select the proper implementation. Alternatively, selection can be made of the re-implementation that reduces time delay the greatest amount, or the first re-implementation that eliminates negative slack. Another alternative is to select the re-implementation that uses the less demanded logic resources; for example, if very few dedicated memory blocks are used in the design, a dedicated memory block implementation of Part 1 is preferred. Other selection methodologies may also be used. The selection may involve user input or be automatic, such as being computer software determined.

This embodiment also covers the case where two or more data signals are deemed most critical. In such a case, a plurality of parts will be separated from the original memory block in place of Part 1 in the preceding description, and each of the said parts will be re-implemented such as described above for Part 1.

Figure 3:
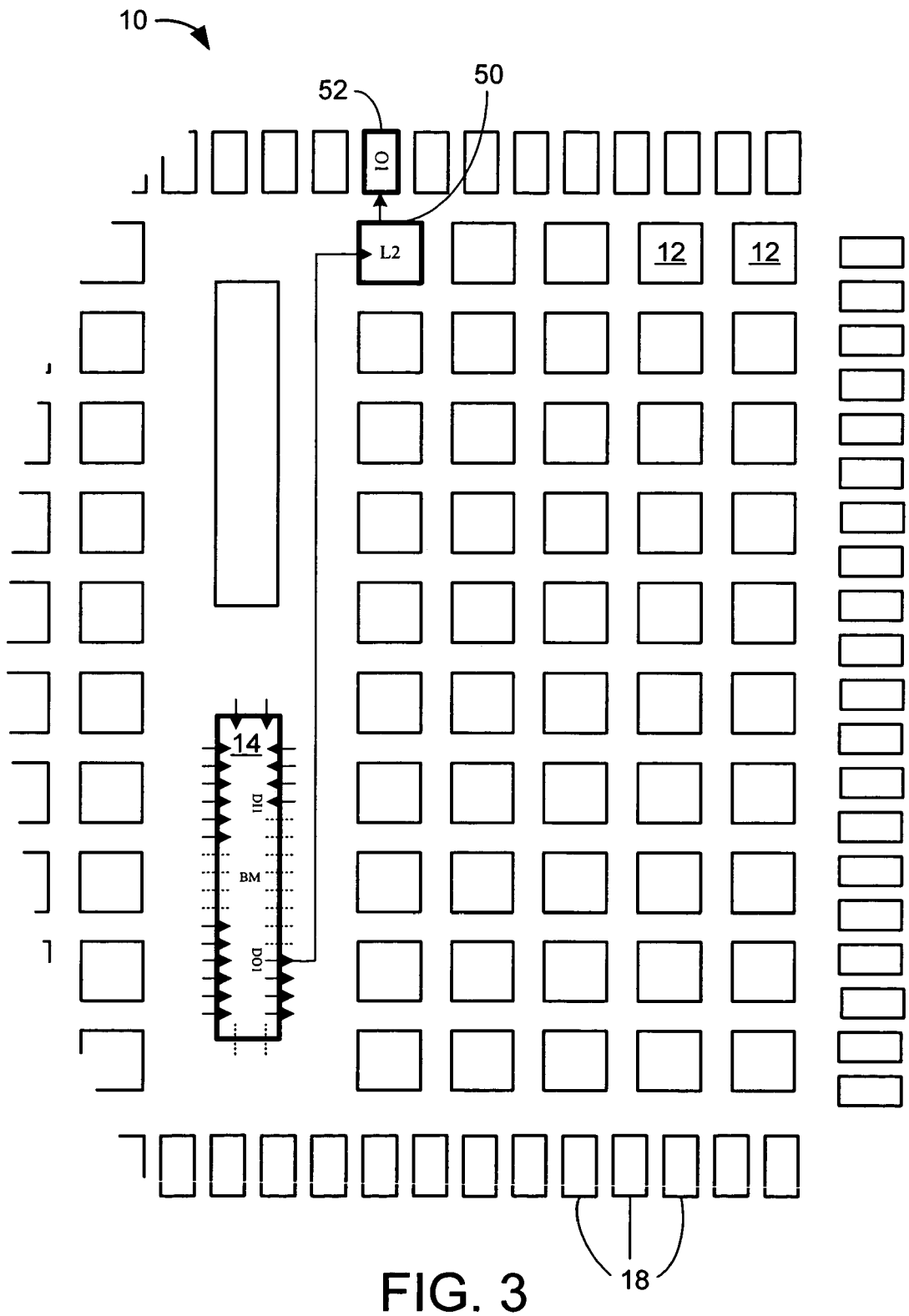
FIG. 3 is a diagrammatic view of a portion of an exemplary FPGA with a memory module implemented by a dedicated memory block.
Figure 4:
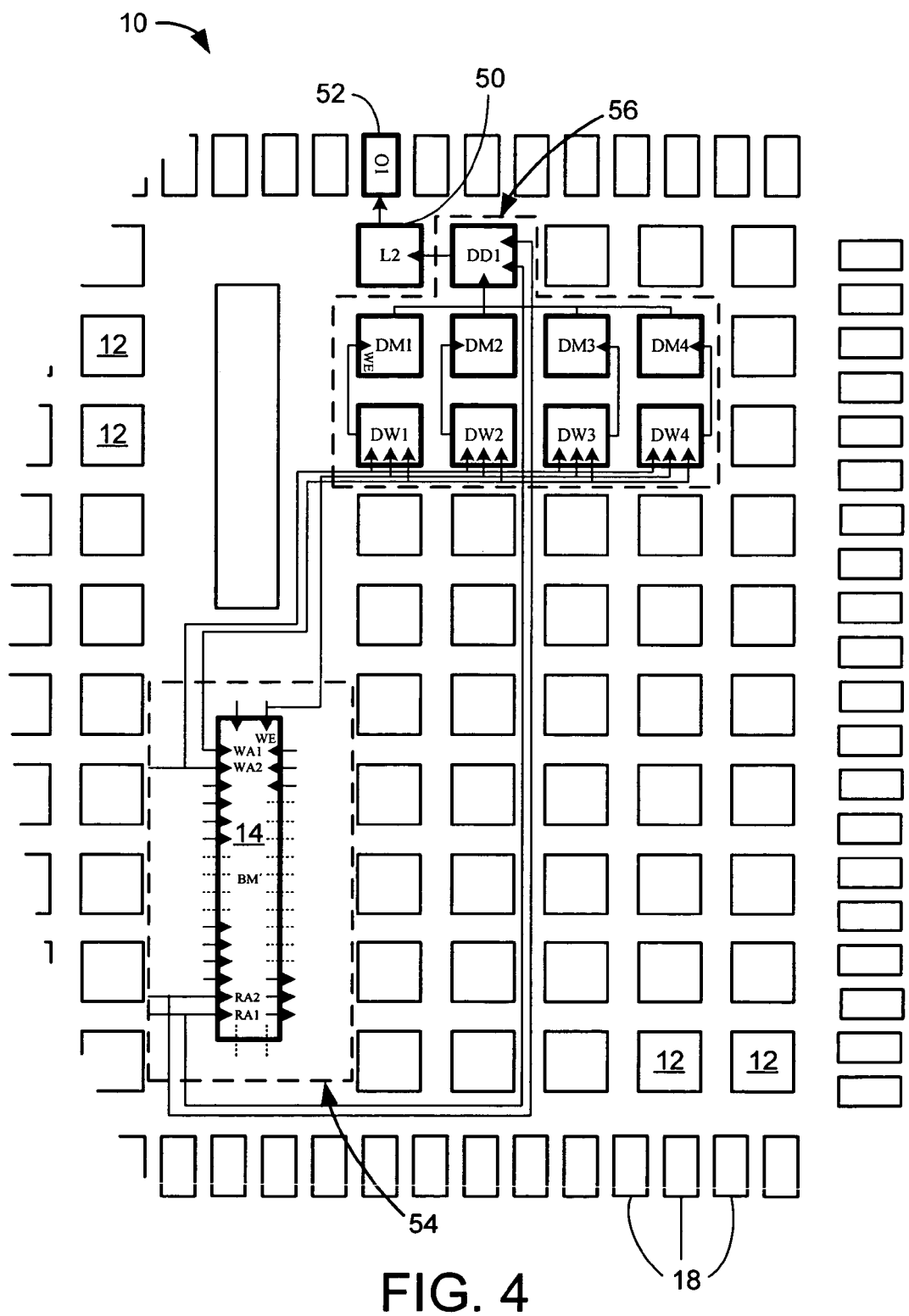
FIG. 4 is a diagrammatic view of the portion of the FPGA of FIG. 3 with the memory module re-implemented by a portion of a dedicated memory block in combination with a plurality of generic logic blocks.

With reference to FIG. 3, a dedicated memory block 14 (BM) realizes the memory module 30 (M) of FIG. 2. Assume the most critical pin in this example implementation is DO1. In this example, pin DO1 is in a path which includes logic block 50 (L2) and output 52 (O1). According to this embodiment, the memory element that is implemented by block 14 is re-implemented by dividing the memory element into two memory sub-modules or parts 54 and 56 as is shown in FIG. 4. Memory sub-module 54 is re-implemented by BM' a portion of dedicated memory block 14 (that is, with DI1 and DO1 of block 14 no longer used—these pins are now shown as dotted lines in the drawing). The other portion 56 of the memory module previously implemented by BM is also re-implemented. In this example, it is determined that a distributed implementation for sub-module 56 is the most beneficial, therefore this portion is realized by 9 generic logic blocks, shown in the region near the upper right corner. Amongst them, 4 logic blocks implement the memory cells (DM1 to DM4). These four memory cells use read addresses RA3 to RA6, write addresses WA3 to WA6, data input DI1, and original write clock WCLK. For convenience, these signals and their connections are not shown in FIG. 4, in order to keep the drawings simple. In this example, write enable signals for the blocks are generated by the 4 logic blocks DW1 to DW4, which decode address signals WA1 and WA2 to enable or disable the original write enable signal WE (refer to the earlier description of FIG. 2). One logic block DD1 selects the output signal DO1 from the outputs of the 4 memory blocks based on the decoding of addresses RA1 and RA2 (refer to description of FIG. 2). The logic blocks are re-arranged to be closer to the destination of the original DO1 and reconnected to realize the benefit of delay reduction.

By separating Part 1 (memory portion 56) and Part 2 (the remaining portion 54), the memory, logic can be re-implemented and the critical portion of it (Part 1) re-arranged/reconnected so that it is closer to its signal source and/or destination, thereby reducing delays. This is one example of one approach set forth herein for separating the signal on the most critical pin from the original block and shifting the signal to a pin of a different logic block which reduces the timing delay. This process can be repeated for other critical pins. When shifting is completed, the shifted signal and new pin are desirably the logical equivalent of the prior pin in that the logic value at the new pin is the same as the logic value at the prior pin for a given input. Thus, the functionality of the memory module is maintained in the re-implementation. Available logic blocks are selected for re-implementation. Desirably, the available logic blocks are from logic blocks or portions thereof that are not already being used in the design. Logic blocks and portions thereof that become available as a result of altering the design may also be used, but typically there are sufficient spare resources (logic blocks) that are available without any design alterations. Available logic blocks are desirably selected to shift signals away from critical pins of logic blocks of a prior memory module implementation.

In the example illustrated in FIG. 4, the illustrated read and write ports are of the same configuration. Therefore, data input buses are divided the same way as data output buses. This is optional as the ports may be of different configurations. In such cases, certain memory cells may have to be duplicated in both parts of the re-implemented memory.

Optimizing a Critical Read Address

This embodiment is an exemplary approach for addressing the case where the identified logic block of a memory implementation is a dedicated memory block, and the most critical pin is a read address (RA1 to RA6 with reference to FIG. 2). In a desirable form of this embodiment, described with reference to FIGS. 5 and 6, during re-implementation, the most critical read address signal is desirably separated from the original memory block, and relocated at a location that is closer to its source, or to the destinations of the data output signals. For example, the memory function implemented by the dedicated logic block 14 in FIG. 5 may be divided into two parts. One part (Part 1) in this example desirably contains the memory cells whose information is accessed when the most critical read address pin has or corresponds to a logic value of 0. The other part (Part 2) in this example desirably will contain the memory cells whose information is accessed when the most critical read address pin has or corresponds to a logic value of 1. The two parts of the re-implemented memory module may be separately realized via a dedicated block implementation, if feasible. If not, then one or both parts can be realized via a distributed implementation or a combination of a dedicated block and distributed implementation. A multiplexer (MUX) may then, for example, be realized for each bit on the data output bus associated with the read address bus of concern to select one of the two outputs as the valid data output.

Figure 5:
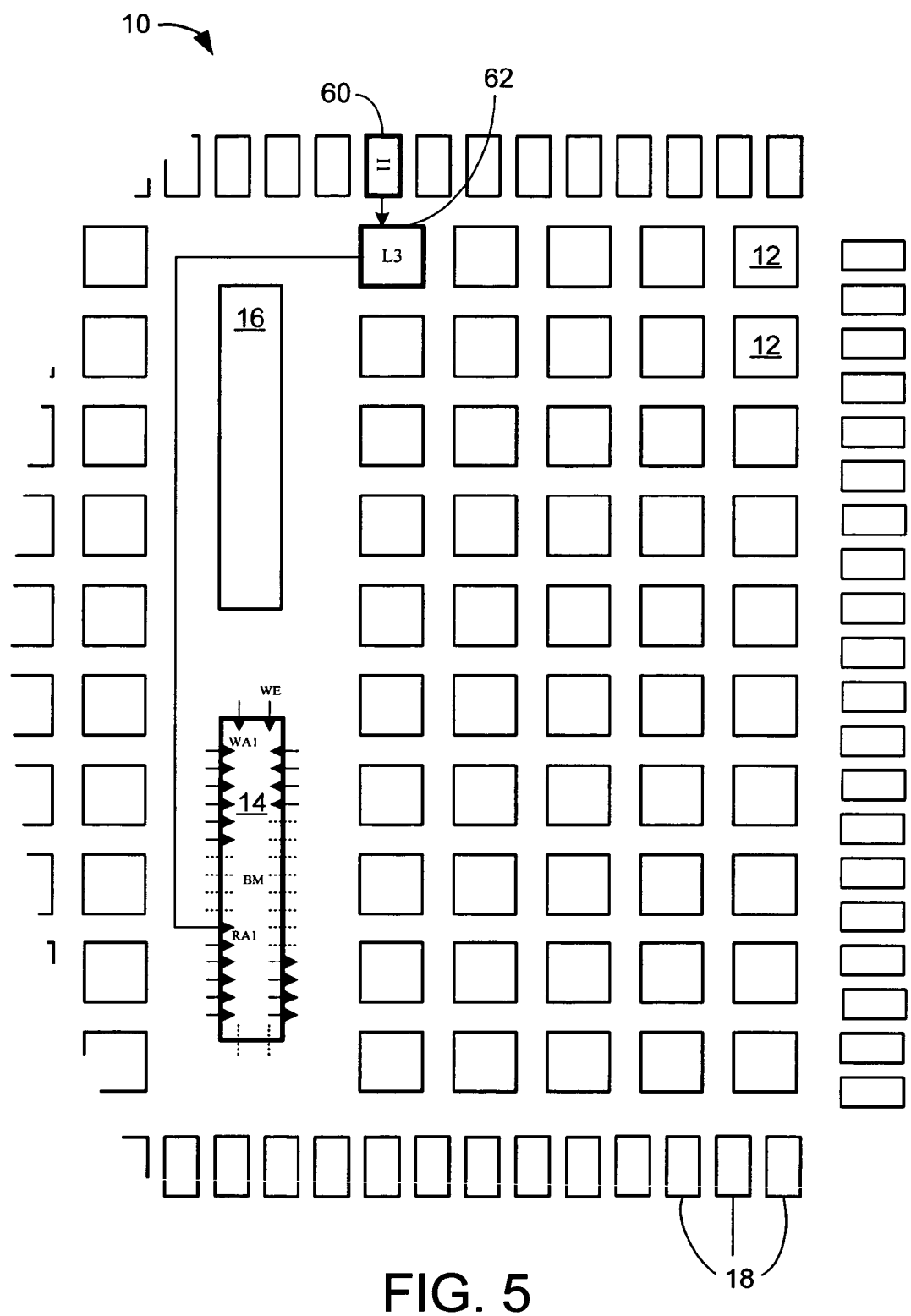
FIG. 5 is a diagrammatic view of a portion of an exemplary FPGA with a memory module implemented by a dedicated memory block.

With reference to FIG. 5, the dedicated memory block 14 (BM) initially realizes the memory module 30 (M) of FIG. 2. Assume the most critical pin is RA1. This path includes input block 60 (I1), logic block 62 (L3) and the connections in this path. According to this embodiment, M is re-implemented by dividing it into two parts, M1 and M2. In this example, M1 contains the memory cells accessed when RA1 is of logic value 0 and M2 contains the memory cells accessed when RA1 is of logic value 1. Although these parts may be realized in other combinations of logic blocks, in FIG. 6, M1 and M2 of the re-implementation are realized by dedicated memory blocks 14 (BM1) and 16 (BM2) respectively, which no longer use the RA1 and WA1 address signals (the pins are shown in dotted lines in FIG. 6). The input and output connections of the blocks are not shown in this figure for simplicity. Additionally, two generic logic blocks DW1 and DW2 are used in this example to select which part of the memory to write to according to the value of WA1. The principles are similar to those explained above in connection with FIGS. 1-4. Another 4 generic logic blocks DR1 to DR4 are used in this example as output MUXes to select the proper output from either BM1 or BM2, depending on the value of RA1. The specific logic functions of DW1-DW2 and DR1-DR4 are evident to those skilled in the art and are thus not shown here. In the re-implementation of FIG. 6, the logic blocks are re-arranged so that RA1 is close to the decoding blocks and reconnected to realize the benefit of delay reduction.

By separating the most critical read address signal out of the original memory block 14, the signal can be reconnected so that it is closer to its source and/or the destinations of data outputs, thereby reducing delays.

This embodiment also covers the case where multiple read address signals are considered most critical. In such case the original memory may be divided into $2^K$ parts if the number of critical address signals is K. The auxiliary logic can be similarly constructed following the examples of DW1-DW2 and DR1-DR4 in the preceding example.

Figure 6:
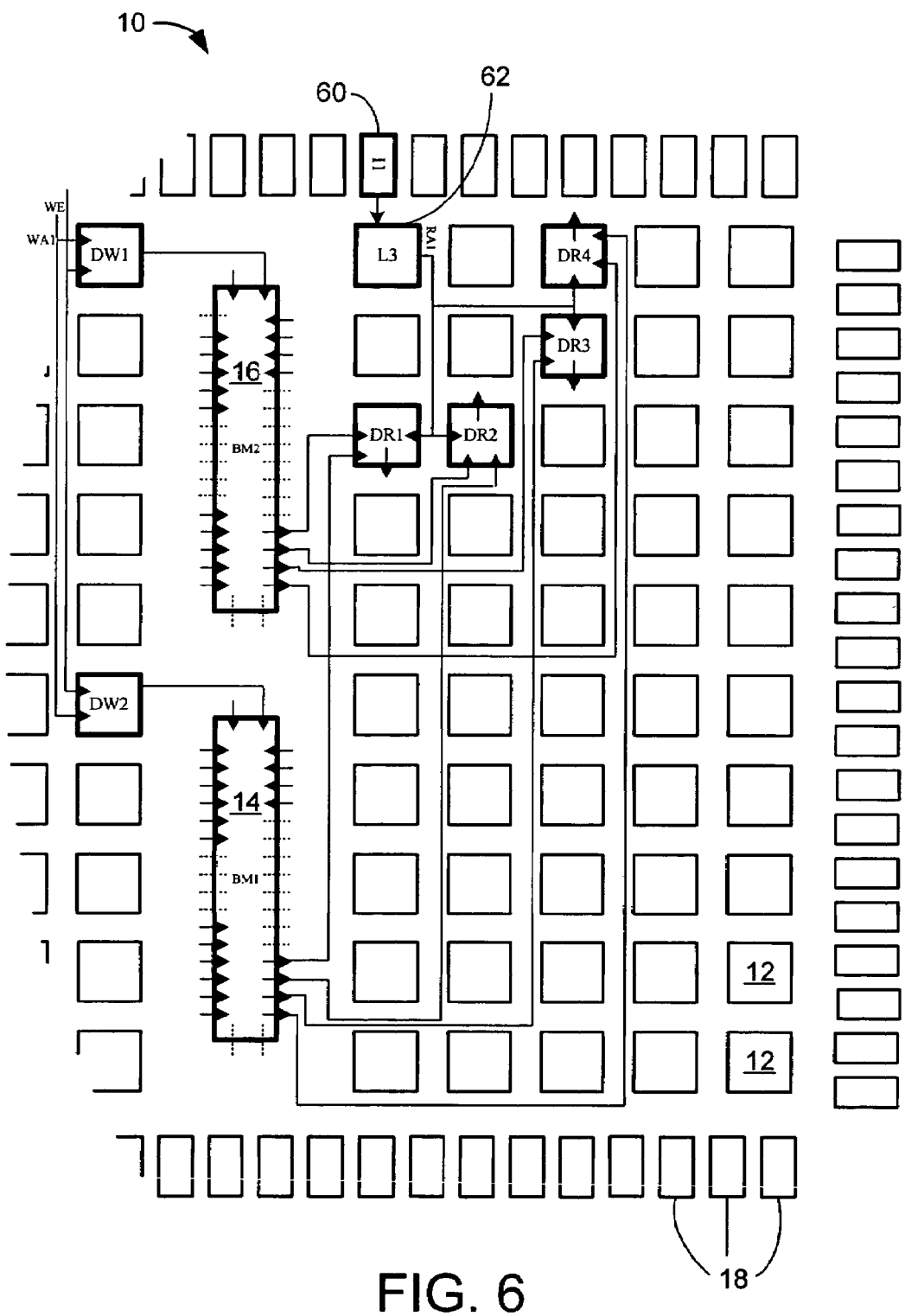
FIG. 6 is a diagrammatic view of the portion of the FPGA of FIG. 5 re-implemented using portions of two dedicated memory blocks in combination with several generic logic blocks.

In the example illustrated in FIGS. 5 and 6, the read and write addresses are of the same configuration. This can readily be adapted to address example cases where the buses are of different configurations. In such cases, certain memory cells may have to be duplicated in both parts in the re-implementation. Also, if the read port is synchronous, necessary registers or components will be used to register the separated read signals.

Optimizing Other Signals of a Dedicated Memory Block

Another embodiment may be used to address the case where the identified logic block of a memory implementation is a dedicated memory block, and the most critical pin is a signal other than those described so far (for example, the write enable signal WE with reference to FIG. 2). In this situation, the memory function realized by a dedicated logic memory block is desirably re-implemented via a distributed implementation.

Figure 7:
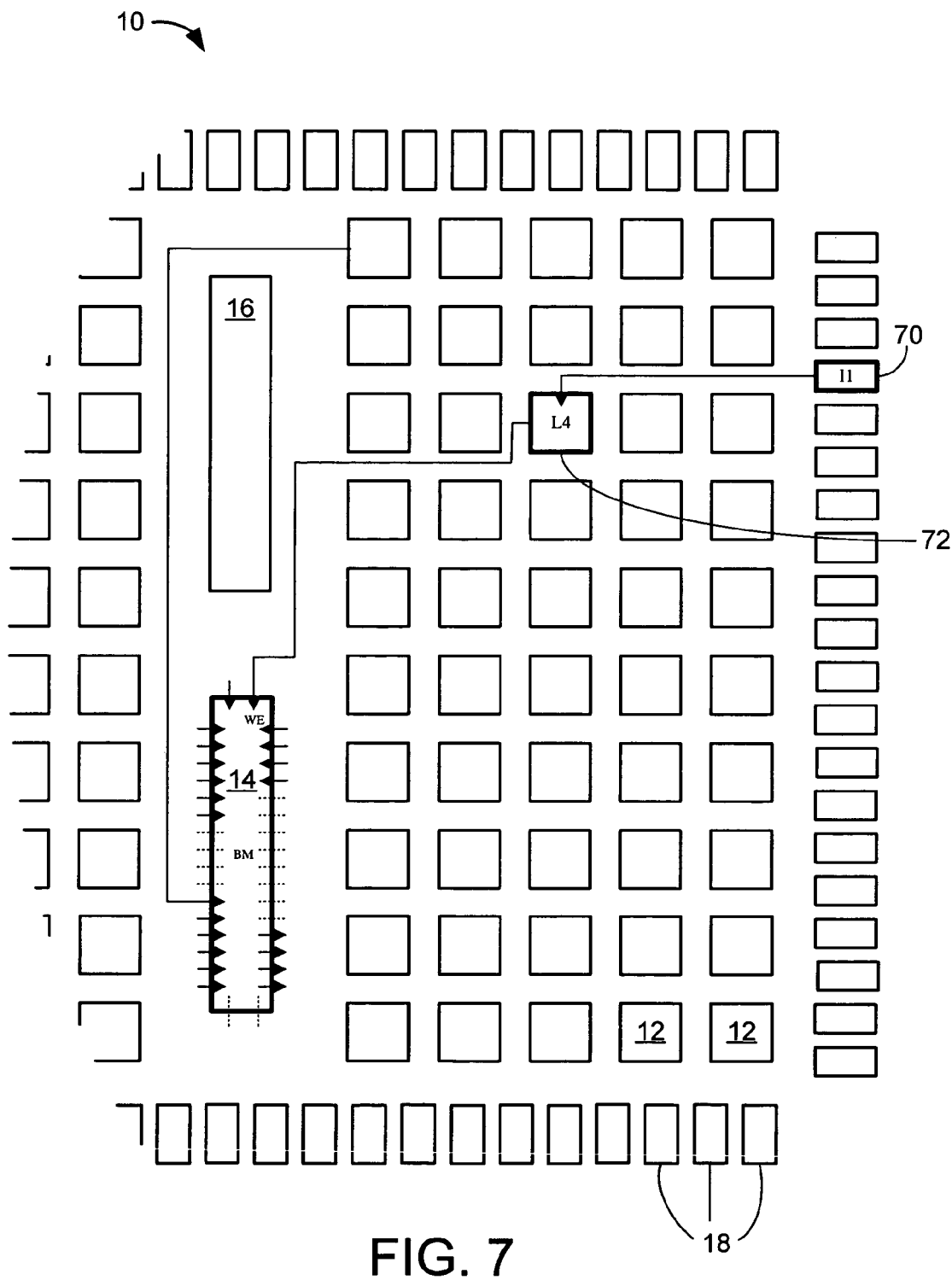
FIG. 7 is a diagrammatic view of a portion of an exemplary FPGA with a memory module implemented by a dedicated memory block.
Figure 8:
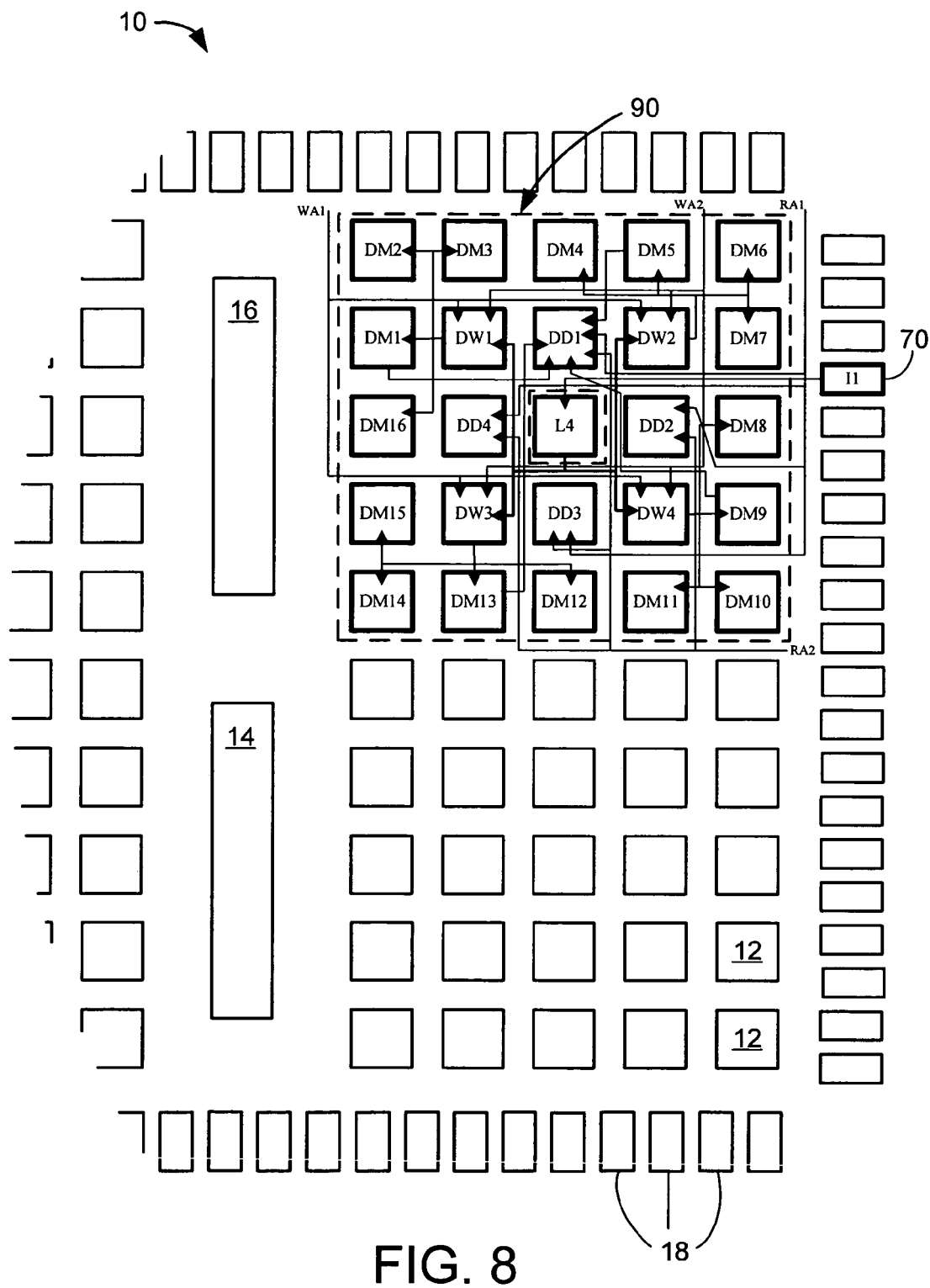
FIG. 8 is a diagrammatic view of the portion of the FPGA of FIG. 7 with the memory module implemented by a plurality of generic logic blocks without the use of a dedicated memory block.

With reference to the example of FIG. 7, the dedicated memory block 14 (BM) realizes the memory module 30 (M) of FIG. 2 in a first or existing implementation. Assume the most critical pin is WE. The path to WE includes input block 70 (I1), logic block 72 (L4) and the associated connections. In this embodiment, M may be re-implemented using a distributed implementation, such as indicated generally by the number 90 in FIG. 8. Re-implementation 90, in the illustrated example of FIG. 8, includes 24 generic logic blocks. Amongst them, 16 are used as memory blocks having 4-bit address paths and 1-bit data paths (DM1 to DM16). These generic logic blocks use read addresses RA3 to RA6, write addresses WA3 to WA6, and write clock WCLK. Each group of 4 blocks in this example share a common data input (for example, DM1, DM5, DM9, and DM13 use DI1 as data input). Another 4 logic blocks DW1 to DW4 in this example decode the extra 2 bits of write addresses WA1 and WA2, and control the write enable signal. The remaining 4 blocks DD1 to DD4 in this example select the output bit based on the two extra bits of read addresses, RA1 and RA2 (refer to description of FIG. 2). The logic blocks in this example are re-arranged to be close to the source of WE and each other, and reconnected, to thereby realize the benefit of delay reduction.

By using a distributed generic block implementation, the logic blocks can be re-arranged so that the most critical pin can be made closer to the source of its signals, with reduced delays. In this example, only a complete re-implementation may actually achieve the desired benefit, since any partial re-implementation will still leave the critical signal WE on the original memory logic block 14.

This embodiment also covers the case where a plurality of signals are deemed critical. Since a distributed re-implementation is desired, the number of such signals is not relevant.

Optimizing Signals of a Generic Logic Block

Another embodiment may be used to address the case where the identified critical logic block in a memory implementation is a generic logic block that realizes part of a memory module. In this situation, alternative re-implementation strategies are desirably evaluated in order to bring the most critical signal closer to its source and/or destination without increasing overall delays of the memory module or the entire design. A rule set method may be used to evaluate alternative strategies. Although the method may vary, in a specific example, the following steps may be implemented:

The other generic logic blocks that implement the same memory module are identified;

The memory module, which is originally realized via a distributed memory or generic block implementation, is re-implemented via a block memory or dedicated block implementation, and re-arranged and reconnected to reduce or more desirably maximize the delay reduction;

The re-implemented dedicated logic block may be further processed such as previously described above.

This can be illustrated by referring to FIG. 1 first, where the block memory implementation (dedicated block 14) can be considered as the transformation or re-implementation outcome of a distributed memory implementation such as like the implementation 40. The FIG. 1 re-implementation 14 may be followed, for example, by either the re-implementation depicted in FIG. 4 (number 56), or the one depicted in FIG. 6, if deemed necessary; or it may stay as is if so doing provides the most benefit in terms of timing improvement.

By transforming the memory implementation into a dedicated block implementation, potential timing improvements from utilizing the more efficient dedicated logic blocks may be explored. Moreover, by further optimizing the block implementation, such as by combinations of dedicated and generic logic blocks, potential timing benefits from using a mixed implementation strategy may also be explored.

The re-implementation procedure may continue until, for example, a re-implementation of memory modules is achieved which results in a sufficient reduction in timing delays, such as resulting in a zero or positive slack in associated paths, or a determination is made to halt the process (e.g., because negative slack is not eliminated by the re-implementation of memory modules). Alternatively, re-implementation may continue until an optimized slack is achieved.

In the strategies mentioned above, which apply to an entire memory module or to a portion of a memory module (or to a plurality of memory modules and/or parts thereof), a memory module implementation using a first set of logic blocks is desirably re-implemented using a second set of logic blocks which is not identical to the first set of logic blocks. The second set of logic blocks may include one or more logic blocks from the first set and may, for example, include a portion of a dedicated block from the first set, or vice versa. In the presence of other logic elements of the design, some or all of the auxiliary logic may also be implemented together with those other logic elements instead or in addition to being implemented using separate logic blocks.

Incremental Re-placement and Re-routing

Desirably, with each of the embodiments described above, the logic blocks generated for re-implementation are re-arranged to more advantageous locations and reconnected using the fastest interconnects in order to realize the potential delay reductions of the re-implementation. This procedure may be integrated with incremental physical timing analysis to facilitate accurate measurement of delays and their reductions. As an example of this integration, which may be varied, the procedure may comprise the following steps:

First, the new logic blocks are placed at or near where the original logic blocks were placed, or wherever appropriate, with overlaps. One effective known method of achieving this is to use a quadratic programming method to determine the preferred initial locations of the new logic blocks. Subsequently, physical timing analysis is performed to update the delay values on affected logic blocks. This includes the update of the timing graph and re-calculation of delays between each pair of links that involves at least one new block, and the propagation of slack changes from the new/updated interconnects through the affected. Such placement desirably does not change the placement of old logic blocks. In so doing, incremental physical timing analysis can desirably be performed most easily with minimal changes.

Then, these blocks are re-placed so that overlaps are eliminated and logic blocks are arranged to advantageous locations. This step can use any known or hereafter developed placement method. As an example, a wirelength based legalization procedure can be used to select and move blocks from overlapped locations to the nearest vacant location. Then, either an iterative movement placement method, which determines the best location of a block based on slacks and moves the block to the location if beneficial, or a simulated annealing method, both of which well known to those skilled in the art, may be used. In accordance with this embodiment, each relocation of a logic block is accompanied by an update of the physical delay (timing slack) information for related interconnects. An exemplary approach to this is to record the change to the delay of the interconnects due to the movement, and propagate such change through the paths associated with the changed interconnect to update slacks. With the use of these known or hereafter developed powerful placement methods, the logic blocks will be moved to locations that best realize the delay reduction potential recognized as a result of the disclosed memory module re-implementation embodiments.

The placement procedure stops, for example, when delay reductions as prescribed in the re-implementation embodiment are realized, or when its advantageous movements have been exhausted without achieving the desired realization. In the former case, the re-implementation may be deemed completed. In the latter case, the changes to the implementation, including those by the placement procedure and those by the re-implementation embodiments, can be reversed and the original implementation restored as the more advantageous solution. Alternatively, instead of a total reversal, a partial reversal may be made to a re-implementation which provided improved timing results over the original implementation.

With the above approach, only a verified beneficial re-implementation is desirably incorporated in the FPGA-implemented circuit design, and therefore no degradation results from the re-implementation procedures.

It should be noted that changes in placement and interconnects are not limited to using new (previously unallocated) logic blocks. That is, other previously used logic blocks may be reprogrammed and moved where desirable to achieve the objective. The use of new (previously unallocated) logic blocks and minimal reprogramming and 20 movement of allocated blocks enhances the speed of the execution. For this reason, the scope of the permitted movement may be prescribed to enhance the efficiency of the re-implementation of memory module procedure. Broader movements of logic blocks may also be used to potentially produce improved timing results, although more time would typically be required in such a case.

Form and Structure of Re-implementation

According to any one or more of the above-described embodiments, one or more memory modules (or a part of thereof) that have originally been implemented by selected dedicated or generic logic blocks can be re-implemented to a more advantageous form. In general cases, the new implementation may contain portions of the re-implemented memory module realized via a dedicated or block memory implementation and portions realized via a generic block or distributed memory implementation. This mixed form of memory module implementation offers extraordinary capability and flexibility as compared to approaches where only a single strategy/implementation (by either dedicated memory blocks, or distributed logic blocks, but not a mixture) is utilized. The benefit from such capability and flexibility is effectively realized in connection with accurate timing analysis and incremental re-placement, as prescribed in the preceding descriptions.

Desirably, the above technology is implemented via one or more computers which typically include a CPU, memory, a display and an input device such as a mouse and/or a keyboard. Such computers are programmed to implement one or more of the various embodiments disclosed herein. In addition, computer readable media, such as computer discs or cards, may be programmed with computer instructions to carry out the above teachings.

Figure 9:
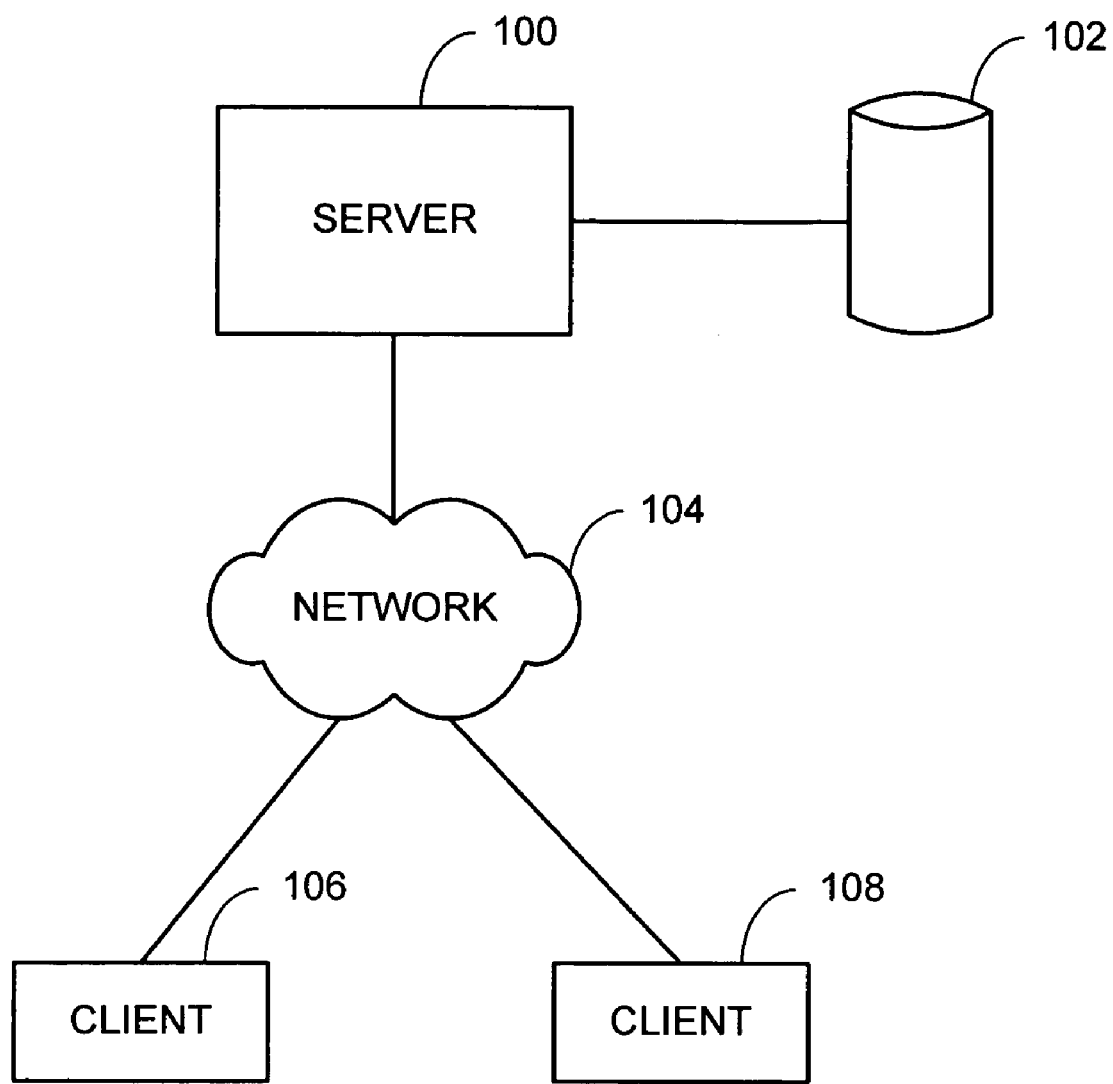
FIG. 9 is a system diagram of a client/server network which may be used in implementing the disclosed memory re-implementation and evaluation technology.

Also, any of the aspects of the technology described above may be performed or designed using a distributed computer network. FIG. 9 shows one such exemplary network. A server computer 100 can have an associated storage device 102 (internal or external to the server computer). For example, the server computer 100 can be configured to re-implement memory modules, rearrange, reconnect and perform timing analysis, placement and routing of designs and re-implemented designs according to any of the embodiments described above (e.g., as part of an EDA software tool). The server computer 100 may be coupled to a network, shown generally at 104, which can comprise, for example, a wide-area network, a local-area network, a client-server network, the Internet, or other such network. One or more client computers, such as those shown at 106, 108, may be coupled to the network 104 using a network protocol.

Figure 10:
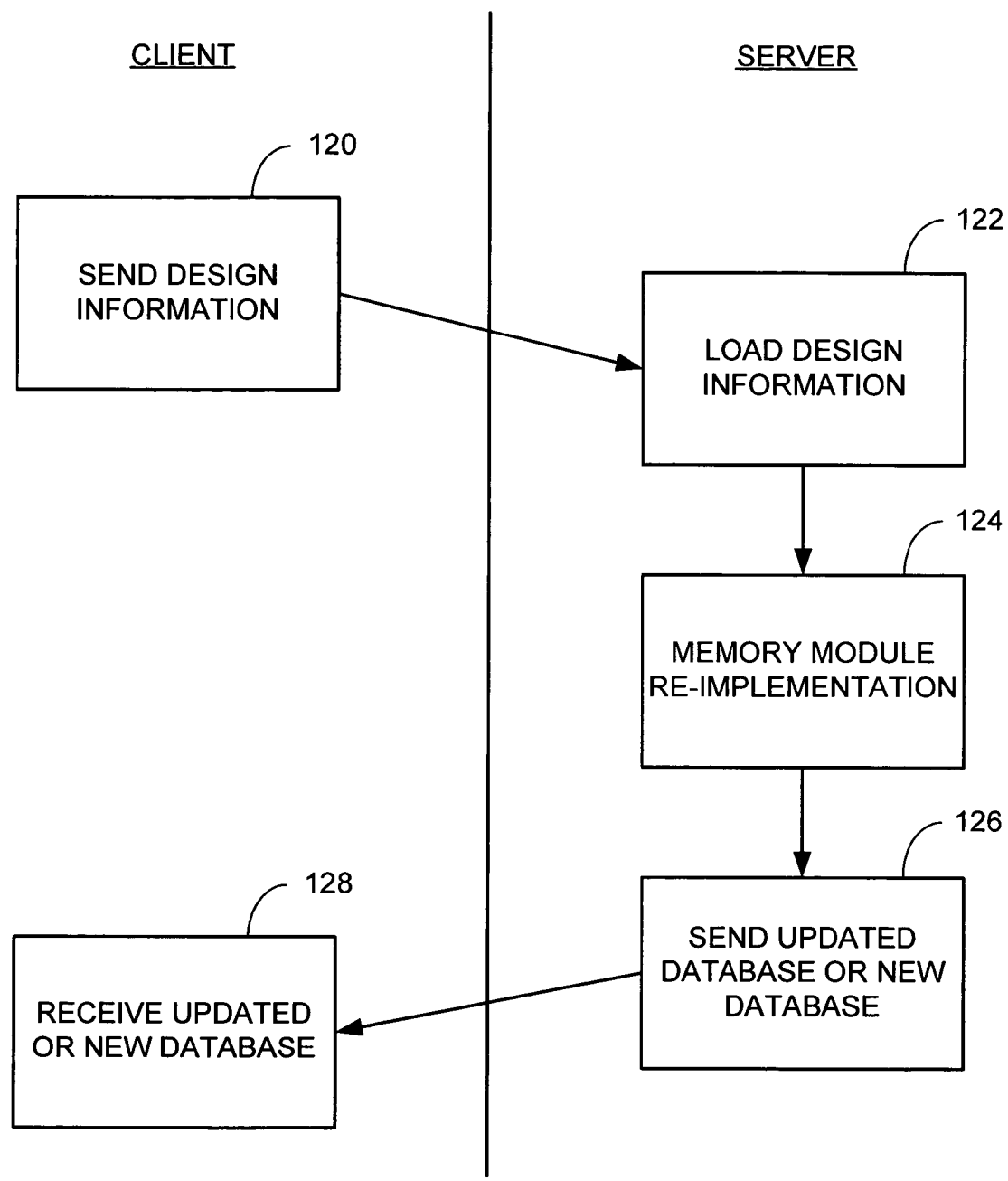
FIG. 10 is a diagrammatic representation showing the creation of a database using, for example, the network of FIG. 9.

FIG. 10 shows that a database containing design information (e.g., programming instructions for an FPGA) may be updated to include design information for designs containing re-implemented memory modules according to any of the embodiments disclosed herein using a remote server computer, such as the server computer 100 shown in FIG. 9. In process block 120, for example, the client computer sends design data relating to an FPGA circuit design containing a memory module which is to be tested or analyzed using one or more of the disclosed memory module re-implementation techniques disclosed herein. For instance, the client computer may send programming instructions for realizing a design in the circuit comprising an FPGA with or without a netlist or other EDA design database. In process block 122, the data is received and loaded by the server computer. In process block 124, the received database is analyzed and a design with one or more (or none if no changes are warranted) re-implemented memory modules in an FPGA is created. This new design data can be stored as an updated version of the design database or as one or more separate databases. In process block 126, the server computer sends an updated program for realizing a design in an FPGA, and/or an updated database or other databases to the client computer, which receives the database in process block 128. It should be apparent to those skilled in the art that the example shown in FIG. 10 is not the only way to update a design database to include the relevant design data. For instance, the design data may be stored in a computer-readable media that is not on a network and that is sent separately to the server. Alternatively, the server computer may perform only a portion of the design procedures.

Having illustrated and described the principles of the invention by several embodiments, it should be apparent that those embodiments can be modified in arrangement and detail without departing from such inventive principles. The described embodiments are illustrative only and should not be construed as limiting the scope of the present invention. Rather, the present invention encompasses all such embodiments and modifications thereto which fall within the scope and spirit of the following claims and equivalents thereto.

We claim:

1. A method of re-implementing at least one memory module having an undesirable timing delay, the at least one memory module having the undesirable timing delay being on an FPGA device, the FPGA device comprising generic logic blocks and dedicated logic blocks, the at least one memory module having the undesirable timing delay being implemented by a first set of at least one of the logic blocks, the at least one logic block of said first set having at least one critical pin, the method comprising:
   (a) identifying the at least one memory module having the undesirable timing delay;
   (b) selecting a second set of logic blocks for use in re-implementing said at least one memory module having the undesirable timing delay, at least a first logic block of the said second set having a pin that is logically equivalent to said at least one critical pin of the at least one logic block of said first set, the first logic block of the second set being non-identical to the at least one logic block of the first set; and
   (c) selectively re-implementing the at least one memory module having the undesirable timing delay using the second set of logic blocks in the event that re-implementation using the second set of logic blocks reduces the undesirable timing delay of the at least one memory module having the undesirable timing delay.

2. A method according to claim 1 wherein the second set comprises at least one dedicated memory logic block and at least one generic logic block.

3. A method according to claim 1 wherein the first set comprises only generic logic blocks and the second set comprises at least one dedicated memory logic block.

4. A method according to claim 1 wherein the first set comprises at least one dedicated memory logic block and the second set comprises at least one more dedicated memory logic block than the said first set.

5. A method according to claim 1 wherein the first set comprises at least one dedicated memory logic block and the second set comprises only generic logic blocks.

6. A method according to claim 1 wherein the act of identifying the at least one memory module comprises performing physical timing analysis on at least said one memory module, the method further comprising performing physical timing analysis on said at least one memory module to identify the at least one critical pin of said first set of at least one logic block, and wherein the method further comprises performing physical timing analysis on the re-implemented memory module using the second set of logic blocks prior to selecting the re-implementation of the at least one memory module using the second set of logic blocks.

7. A method according to claim 1 comprising the act of reversing the re-implementation to an implementation of the at least one memory module using the first set of logic blocks in the event the undesirable timing delay of the at least one memory module is not sufficiently reduced upon re-implementation using the second set of logic blocks.

8. A method according to claim 1 comprising repeating the acts of claim 1 for one or more additional sets of logic blocks which are non-identical to one another and which are non-identical to the first and second sets.

9. A method according to claim 8 in which the selectively re-implementing act comprises the act of selecting a set of logic blocks for re-implementing the at least one memory module which eliminates the undesirable timing delay.

10. A method according to claim 8 comprising the act of reversing a subsequent re-implementation of the at least one memory module to a prior implementation or prior re-implementation in the event the undesirable timing delay of the at least one memory module is not sufficiently reduced by the subsequent re-implementation of the at least one memory module.

11. A computer programmed to implement the method of claim 1.

12. Computer readable media programmed with computer readable instructions to carry out the method of claim 1.

13. For use in a computer system, a design database of FPGA programming instructions stored on computer readable media for a re-implemented memory module which has been re-implemented in accordance with the method of claim 1.

* * * * *

UNITED STATES PATENT AND TRADEMARK OFFICE
CERTIFICATE OF CORRECTION

PATENT NO. : 7,251,803 B2
APPLICATION NO. : 10/785608
DATED : July 31, 2007
INVENTOR(S) : Suaris et al.

It is certified that error appears in the above-identified patent and that said Letters Patent is hereby corrected as shown below:

Column 1, line 52, "modem" should read -- modern --

Column 5, line 42, "implementation" should read -- implementation. --

Column 8, line 12, "Part 1.A" should read -- Part 1. A --

Column 13, line 6, "which well known" should read -- which are well known --

Column 13, line 43, "and 20 movement" should read -- and movement --

Signed and Sealed this

Fifteenth Day of April, 2008

JON W. DUDAS
*Director of the United States Patent and Trademark Office*